(12) United States Patent
Vereecke

(10) Patent No.: US 11,434,424 B2
(45) Date of Patent: Sep. 6, 2022

(54) AQUEOUS SOLUTION FOR ETCHING SILICON OXIDE

(71) Applicant: IMEC VZW, Leuven (BE)

(72) Inventor: Guy Vereecke, Chastre (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/353,092

(22) Filed: Jun. 21, 2021

(65) Prior Publication Data
US 2022/0098485 A1    Mar. 31, 2022

(30) Foreign Application Priority Data

Sep. 30, 2020 (EP) ..................................... 20199275

(51) Int. Cl.
| | |
|---|---|
| C09K 13/04 | (2006.01) |
| C09K 13/08 | (2006.01) |
| H01L 21/306 | (2006.01) |
| H01L 21/311 | (2006.01) |
| H01L 21/3213 | (2006.01) |

(52) U.S. Cl.
CPC .............. *C09K 13/04* (2013.01); *C09K 13/08* (2013.01); *H01L 21/30604* (2013.01); *H01L 21/31111* (2013.01); *H01L 21/31133* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 6,200,891 | B1 | 3/2001 | Jagannathan et al. |
| 7,192,860 | B2 | 3/2007 | McFarland et al. |
| 8,119,537 | B2 | 2/2012 | Shea et al. |
| 9,399,734 | B2 | 7/2016 | Itano et al. |
| 2018/0265819 | A1* | 9/2018 | Kang .................... H01L 21/304 |

FOREIGN PATENT DOCUMENTS

| | | |
|---|---|---|
| KR | 20180109533 A | 10/2018 |
| KR | 20180110495 A | 10/2018 |

OTHER PUBLICATIONS

Wen et al., "Activity and Osmotic Coefficients of Four Symmetrical Tetraalyklammonium Fluoride in Aqueous Solution", Journal of Physical Chemistry, vol. 70, pp. 1244-1248. (Year: 1966).*
Nanochip Technology Journal, vol. 10, issue 1, 2012, 35 pages.
Extended European Search Report from the European Patent Office, dated Mar. 19, 2021, for European Patent No. 20199275.7, pp. 1-6.
Opallo, M., et al., "Tetra-alkylammonium cation Clathrate Hydrates as Novel Proton", Solid State Ionics, 1997, vol. 97, pp. 247-252.

* cited by examiner

*Primary Examiner* — Jiong-Ping Lu
(74) *Attorney, Agent, or Firm* — McDonnell Boehnen Hulbert & Berghoff LLP

(57) ABSTRACT

An aqueous solution for etching silicon dioxide and method of use are provided. The aqueous solution includes the anion $F^-$ in a concentration ranging from 2 to 4 mol/l and a cation of formula $RR'R''R'''N^+$ in a concentration ranging from 1.5 to 2 mol/l, wherein each of R, R', R", and R'" are independently selected from hydrogen and $C_{1-5}$ alkyl chains with the proviso that the total number of carbon atoms in R, R', R", and R'" combined equals from 8 to 16.

17 Claims, 4 Drawing Sheets

AQUEOUS SOLUTION FOR ETCHING SILICON OXIDE

CROSS-REFERENCE

This application claims priority from European patent application no. 20199275.7, filed on Sep. 30, 2020, which is incorporated by reference in its entirety.

TECHNICAL FIELD OF THE DISCLOSURE

The present disclosure relates to the field of semiconductor processing and more in particular to aqueous solution for etching silicon oxide during such processing.

BACKGROUND OF THE DISCLOSURE

In the field of semiconductor processing, silicon oxide is widely used as an electrically isolating material. Oftentimes, silicon oxide has to be etched.

In some processes, the silicon oxide to be etched is present at different locations differing by level of confinement. For instance, in FinFET processing, parallel silicon fins are formed that are separated by gaps not exceeding 50 nm and sometimes as small as 2 nm. When silicon oxide is present both in and out of these gaps, etching of the silicon oxide can occur at very different etching speeds in and out of the gaps, which is usually not desired. This phenomenon is called pattern loading. Pattern loading is typically more severe when the gaps are smaller because it mostly results from a difference in how the etching species interact with silicon oxide under different confinement conditions. When the silicon oxide present in and out of the gaps has the same density, as if for instance the case with thermal oxide, a higher etch rate is typically observed out of the gaps than in the gaps. In such cases, to avoid pattern loading, dry etching techniques can be used. However, such techniques are relatively expensive as they require expensive equipments. Examples of such etch systems are TEL's Certas LEAGA™ and Applied Materials's SiCoNi™. Wet cleaning processes are cheaper but also more prone to pattern loading. Examples of wet cleaning chemistries that have shown good result in avoiding pattern loading in thermal oxides are buffered HF aqueous solutions.

Matters are further complicated when the silicon oxide present in and out of the gaps differ in density. This is the case for instance when the silicon oxide is deposited by Flowable Chemical Vapor Deposition (FCVD). FCVD occurs through the reaction of a carbon-free silicon precursor and an inorganic reactant gas, resulting in the formation of a low viscosity material on the substrate surface (see *NanochipTechJournal*, vol. 10, issue 1, December 2011). The result is a high-density, non-porous silicon oxide. FCVD is increasingly used as it is a process enabling the filling of gaps with very small dimensions (e.g. <20 nm), high aspect ratio (e.g. up to 30:1), and/or complex shapes. However, the density of the silicon oxide obtained by FCVD tends to differ in different confinement conditions. In fact, it is lower in the gaps than out of the gaps. This means that existing etching technologies suitable for avoiding pattern loading during thermal oxide etching cannot directly be applied with the same success on FCVD oxide. FIG. 1 shows, for instance, that a buffered HF solution (BHF) comprising 7 volume parts of an NH4F solution (40 wt %, 10.8 mol/L) for 1 volume part of an HF solution (49 wt %, 27 mol/L) leads to more pattern loading in presence of FCVD oxides in and out 15 nm gaps than a standard 0.5 vol % HF solution while for thermal oxide, the opposite is true.

There is therefore a need in the art for new technologies suitable for avoiding pattern loading during silicon oxide etching.

SUMMARY OF THE DISCLOSURE

It is an object of the present disclosure to provide good aqueous solutions and methods for etching silicon oxide.

The above objective can be accomplished by a method and device according to the present disclosure.

In one embodiment, the aqueous solutions of the present disclosure can allow for the obtention of a low pattern loading when etching oxides present in and out of gaps having a width smaller than 50 µm.

In another embodiments, the aqueous solutions can allow for the obtention of a low pattern loading while maintaining a good etching rate.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DETAILED DESCRIPTION OF THE DISCLOSURE

Figure 1:
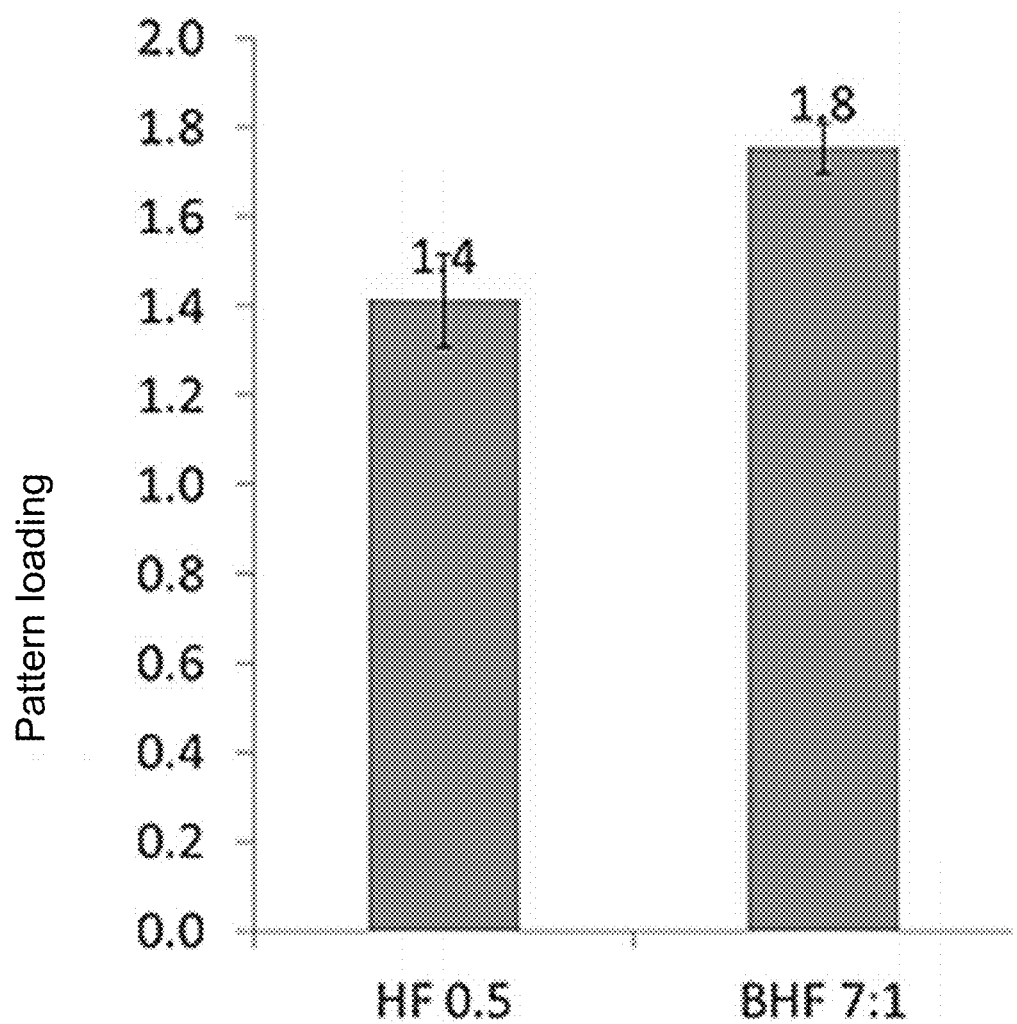
FIG. 1 is a column chart comparing the pattern loading of two solutions of the prior art.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It will be understood that the terms so used are interchangeable under appropriate circumstances and that the embodiments of the disclosure described herein are capable of operation in other sequences than described or illustrated herein.

The term "comprising", as used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment but may be referring thereto. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, should not be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

In a first aspect, the present disclosure relates to an aqueous solution comprising the anion $F^-$ in a concentration of from 2 to 4 mol/l and a cation of formula $RR'R''R'''N^+$ in a concentration of from 1.5 to 2 mol/l, wherein each of R, R', R'', and R''' are independently selected from hydrogen and $C_{1-5}$ alkyl chains with the proviso that the total number of carbon atoms in R, R', R'', and R''' combined equals from 8 to 16.

In embodiments, the anion $F^-$ may be in a concentration ranging from 2.2 to 3.0 mol/l, usually ranging from 2.4 to 2.8 mol/l.

In embodiments, the cation of formula $RR'R''R'''N^+$ may be in a concentration ranging from 1.6 to 1.9 mol/l, usually ranging from 1.7 to 1.9 mol/l.

When one or more of R, R', R'', and R''' is a $C_{3-5}$ alkyl chain, it may be branched or linear.

Generally, R, R', R'', and R''' are independently selected from $C_{1-5}$ alkyl chains.

In embodiments, the total number of carbon atoms in R, R', R'', and R''' may combine to equal from 10 to 14. This range can be beneficial as it is usually cheaper and more soluble than when more than 14 carbon atoms are present and it leads to more effective solutions to reduce pattern loading than when less than 10 carbon atoms are present.

In embodiments, the total number of carbon atoms in R, R', R'', and R''' may combine to equal 12. Such compounds have the highest efficiency/price ratio and the highest efficiency/solubility ratio.

In embodiments, R, R', R'', and R''' may be n-propyl chains. Four N-propyl chains give better results concerning the reduction of pattern loading than four ethyl chains. Also, four N-propyl chains are more soluble and less expensive than four butyl chains. Four N-propyl chains can give good results in terms of avoiding pattern loading. One may use the aqueous solution at a temperature of at least 30° C. and/or one may decrease the pH of the solution, e.g. to less than 6.2 in order to increase solubility if needed.

In embodiments, the molar ratio between $F^-$ and the cation of formula $RR'R''R'''N^+$ may range from 1.1 to 2.3, from 1.2 to 2.0, or from 1.3 to 1.7. Typically, the molar ratio ranges from 1.3 to 1.6. These ranges may be suitable for reducing pattern loading compared to HF 0.5 vol % or buffered HF (7 volumes of concentrated HF for one volume of concentrated ammonia).

In embodiments, the aqueous solution may be prepared by mixing at least the following components: water, HF, and RR'R"R"'N$^+$OH$^-$ For instance, the aqueous solution may be prepared by mixing at least water, HF, and tetrapropylammonium hydroxide or at least water, HF, and tetrabutylammonium hydroxide.

In embodiments, the aqueous solution may be prepared by mixing at least the following components: water and RR'R"R"'N$^+$F$^-$ For instance, the aqueous solution may be prepared by mixing at least water and tetrapropylammonium fluoride or at least water and tetrabutylammonium fluoride.

In embodiments, the pH of the solution may be lower than 6.2, generally ranging from 3.5 to 6.1, ranging from 3.7 to 5.9, or ranging from 3.9 to 5.6. Typically, the pH of the solution ranges from 5.2 to 5.6. The pH has an influence on the etching speed. Lower pHs can allow higher etching speed both within the gap and outside thereof. When the pH is lowered for the purpose of increasing the etching speed, it is generally lowered with one or more acids other than HF. Indeed, adding HF to decrease the pH can also increases the pattern loading. Hence, in embodiments, the aqueous solution may comprise one or more acids other than HF. The presence of theses one or more acids allows decreasing the pH below 6.0, below 5.0, or even in the range from 3.5 to 4.5, thereby increasing the etching speed, but also do not negatively impact the positive effect of the aqueous solution on pattern loading. In embodiments, the one or more acids may be selected from inorganic acids and organic acid. Inorganic acids are generally used, usually strong acids and in particular strong inorganic acids. Examples of suitable inorganic acids are HCl and phosphoric acid.

Figure 5:
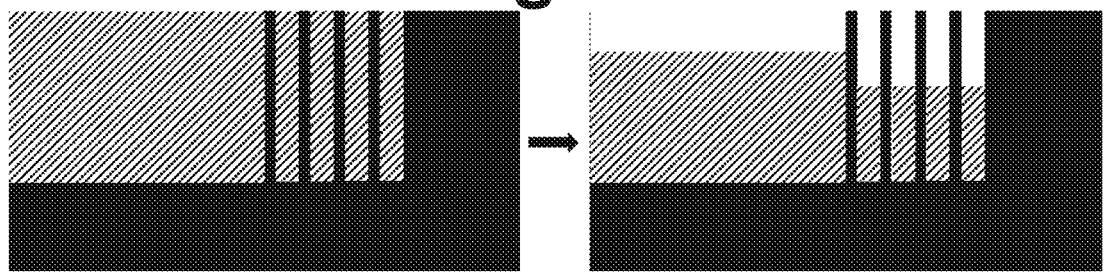
FIG. 5 is a schematic representation of the presence of a pattern loading (top) and its absence (bottom).
Figure 5:
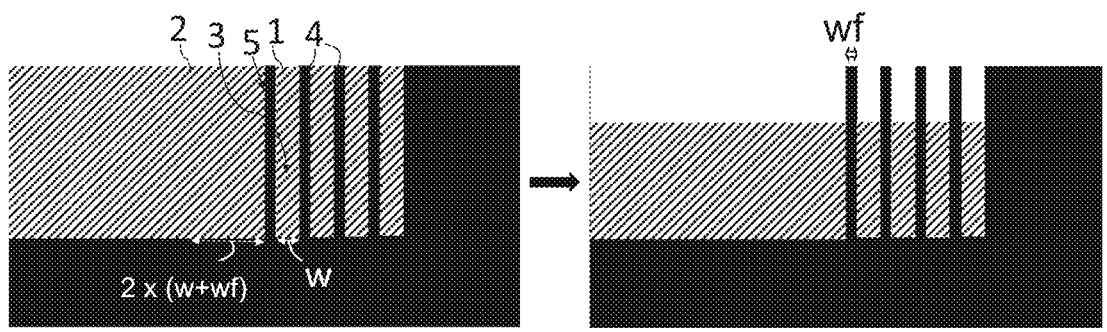

FIG. 5 is now referred to below.

In a second aspect, the present disclosure relates to a method for etching a first silicon oxide (1) present in a gap (3) between features (4), said gap (3) having a width (w) of at most 50 nm, and for etching a second silicon oxide (2) present at a side (5) of a feature (4) wherein the second silicon oxide (2) extends for at least two times the addition of the gap width (w) to the feature width (wf) ($\geq 2\times(w+wf)$) from that side (5), the method comprising exposing the first and the second silicon oxides (1, 2) to an aqueous solution according to any embodiment of the first aspect. In other words, in a second aspect, the present disclosure relates to a method for etching a first silicon oxide present in a first gap between features, said first gap having a width of at most 50 nm, and for etching a second silicon oxide present outside of such a first gap, e.g. in a second gap having as width at least two times the addition of the gap width (w) to the feature width (wf) (e.g. a second gap of at least 96 nm if the first gap width is 36 nm and the feature width is 12 nm) or in an area present at a side of a feature not facing a second feature, the method comprising exposing the first and the second silicon oxide to an aqueous solution according to any embodiment of the first aspect.

The temperature of the aqueous solution according to the first aspect used in the second aspect may, for instance, range from 10 to 90° C., range from 20 to 80° C., or range from 25 to 60° C. Typically, the temperature ranges from 30 to 50° C. Upon preparation of the solution, e.g. upon mixing at least the following components at room temperature: water, HF, and RR'R"R"'N$^+$OH$^-$, the temperature of the solution may raise to a temperature in the range 40-60° C. due to the mixture being exothermic. This exothermicity can be beneficial as it helps dissolving the RR'R"R"'N$^+$OH$^-$.

Figure 6:
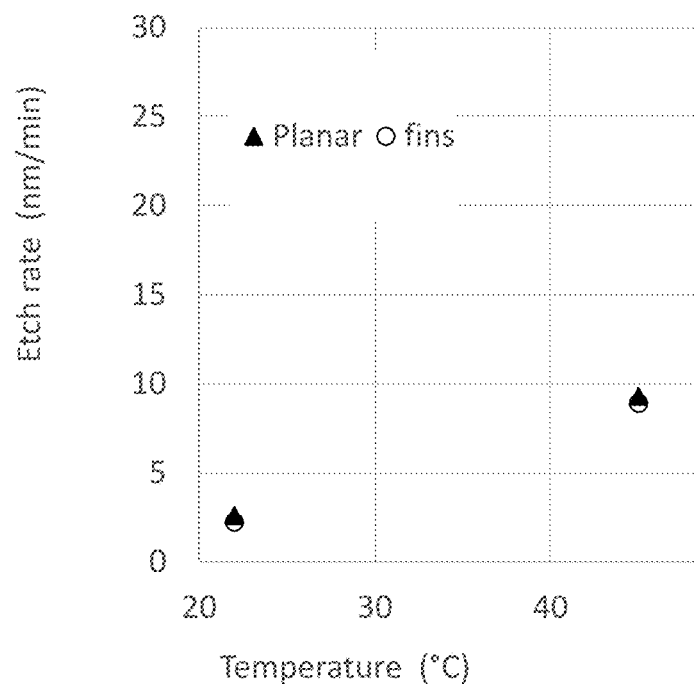
FIG. 6 is a graph showing the etch rate as a function of the temperature for an aqueous solution according to the first aspect of the present disclosure.
Figure 7:
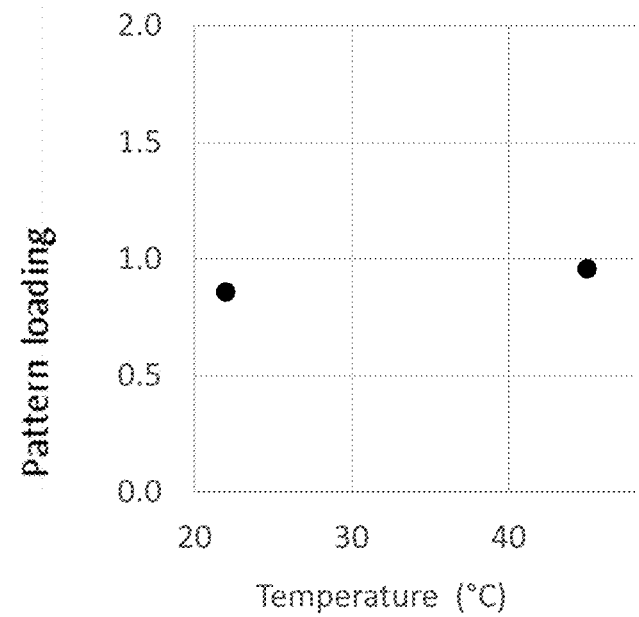
FIG. 7 is a graph showing the pattern loading obtained with aqueous solutions according to the first aspect of the present disclosure and according to the prior art.

In FIG. 6, the etch rate of features (fins) and space present away from said features (planar) obtained with a TPAH:HF 100:10 solution has been measured at 22° C. and at 45° C. As can be seen, the etch rate of both features and spaces raises with temperature. Also, this increase in etch raise is similar at the level of the features and at the level of the space away from the feature. As can be observed in FIG. 7, this may translate in a pattern loading that remains very low both at 22° C. and at 45° C.

In FIG. 5, the dimension of the width (w) can take any value of at most 50 nm and is not limited to the value actually represented in the figure.

In embodiments, the first and the second silicon oxides are obtainable or obtained by flowable chemical vapor deposition (FCVD). When the first and second oxides are obtained or obtainable by flowable chemical vapor deposition, the density of the first silicon oxide tend to be lower than the density of the second silicon oxide.

Typically, FCVD includes depositing a flowable dielectric material (in some implementations, in a liquid state) and converting the flowable dielectric material into a solid dielectric material (for example, by an annealing process). The flowable dielectric material flows on the substrate and conforms to exposed surfaces of the substrate, enabling void free filling of gaps between substrate features. For example, the FCVD process introduces a silicon-containing precursor and an oxidizer (collectively referred to as reactants) into a deposition chamber, where the silicon-containing precursor and the oxidizer react and condense onto exposed surfaces of the substrate to form a flowable dielectric material. In some implementations, the flowable dielectric material may be a flowable silicon-oxygen-and-nitrogen containing material, where the flowable silicon-oxygen-and-nitrogen containing material includes Si—OH, Si—H, Si—O, and/or Si—N bonds. An annealing process can convert the flowable silicon-oxygen-and-nitrogen material into a silicon oxide layer. In such embodiments, the annealing process promotes formation of Si—Si and/or Si—O bonds and reduces Si—N and/or Si—H bonds. In some implementations, the annealing process converts Si—OH, Si—H, and/or Si—N bonds into Si—O bonds. In some implementations, the annealing process is a thermal annealing process that heats the substrate to a temperature that can facilitate conversion of the flowable dielectric material into the solid dielectric material. The thermal annealing process can heat the substrate via a substrate stage (on which the substrate is secured), a lamp source, a laser source, other source, or combinations thereof. In some implementations, the flowable dielectric material is exposed to UV radiation during the annealing process.

The second silicon oxide extends laterally for at least two times the addition of the gap width (w) to the feature width (wf) from that side. For instance, it may extend laterally for at least two times the addition of the gap width (w) to the feature width (wf) from that side (e.g. for four times the addition of the gap width (w) to the feature width (wf)) because it is present in a gap which width is at least two times the addition of the gap width (w) to the feature width (wf) (e.g. four times the addition of the gap width (w) to the feature width (wf)) or it may extend laterally for at least two times the addition of the gap width (w) to the feature width (wf) (e.g. four times the addition of the gap width (w) to the feature width (wf)) because the distance between the side of the feature and a side of the second oxide facing the side of the feature is at least two times the addition of the gap width (w) to the feature width (wf) (e.g. equals four times the addition of the gap width (w) to the feature width (wf)).

In embodiments, the second silicon oxide may extend laterally for at least four times the addition of the gap width (w) to the feature width (wf), generally for at least six times the addition of the gap width (w) to the feature width (wf) from the side of the feature.

In embodiments, the density of the first oxide may be smaller than the density of the second oxide. This is for instance the case when the first and the second oxide are obtainable by flowable chemical vapor deposition. When the density of the first oxide is smaller than the density of the second oxide, the etching of the first oxide tend to be faster than the etching of the second oxide for typical aqueous solutions of the prior art, thereby leading to pattern loading. The aqueous solution of the present disclosure is particularly adequate for limiting pattern loading in situations where the density of the first oxide is smaller than the density of the second oxide.

In embodiments, the density of the first oxide may be at least 1% smaller than the density of the first oxide.

In embodiments, before exposing the first and the second oxide to the aqueous solution, the method may comprise the steps of:
  a. Providing a substrate comprising features having a gap therebetween, said gap having a width of at most 50 nm, and a space extending for at least two times the addition of the gap width (w) to the feature width (wf) from a feature (e.g. extending for at least 96 nm from a feature if the gap width is 36 nm and the feature width is 12 nm),
  b. filling the gap and the space with silicon oxide by flowable chemical vapor deposition, thereby forming the first oxide in the first gap and the second oxide in the space.

In embodiments, the width of the gap may range from 2 to 45 nm, frange from 5 to 25 nm, and generally ranging from 5 to 20 nm. Pattern loading tends to become more pronounced for smaller gaps. Hence, the present disclosure is most useful for the smallest gaps.

In embodiments, the features may be nanofeatures, i.e. features have a width of less than 100 nm wherein the width of the nanofeature is measured in the direction in which the width of the gap is measured. In embodiments, the nanofeatures may have a width of less than 30 nm. For instance, they may be fins having a width of less than 30 nm.

In embodiments, three or more consecutive features may be present and two or more gaps having a width of at most 50 nm may be present.

Example 1

Referring to FIG. 5, a series of aqueous solutions have been compared to one another for etching a first silicon oxide (1) formed by FCVD between fins (4) separated by gaps (3) having a width (w) of 15 nm and a second silicon oxide (2) also formed by the same FCVD process and present in a space extending for at least two times the addition of the gap width (w) to the fin (4) width (wf) from the side (5) of the fin (4). These solutions were as follow:
  a buffered HF solution (BHF 7:1) prepared by mixing 7 volume parts of an NH4F solution (40 wt %, 12.9 mol/L) with 1 volume part of an HF solution (49 wt %, 28.2 mol/L), in accordance with the prior art,
  an aqueous HF solution 0.5% vol according to the prior art,
  a 100:16 aqueous solution obtained by mixing 100 volumes of saturated tetrapropylammonium hydroxide with 16 volumes of saturated HF,
  a 100:13 aqueous solution obtained by mixing 100 volumes of saturated tetrapropylammonium hydroxide with 13 volumes of saturated HF,
  a 100:12 aqueous solution obtained by mixing 100 volumes of saturated tetrapropylammonium hydroxide with 12 volumes of saturated HF, and
  a 100:10 aqueous solution obtained by mixing 100 volumes of saturated tetrapropylammonium hydroxide with 10 volumes of saturated HF.

The obtained pattern loading, defined as the etching depth in the first oxide on the etching depth in the second oxide, is depicted in FIG. 1 for HF 0.5 and BHF 7:1. An illustration of what the pattern loading looks like when either HF 0.5 or BHF 7:1 is used is visible on top of FIG. 5. In the prior art, when the gaps and the space are filled with a thermal oxide, BHF 7:1 shows lower pattern loading than HF 0.5. However, as can be seen in FIG. 1, when the oxide used is a flowable silicon oxide, the tendency is reversed, and a lower pattern loading is observed with HF 0.5 than with BHF 7:1.

Figure 2:
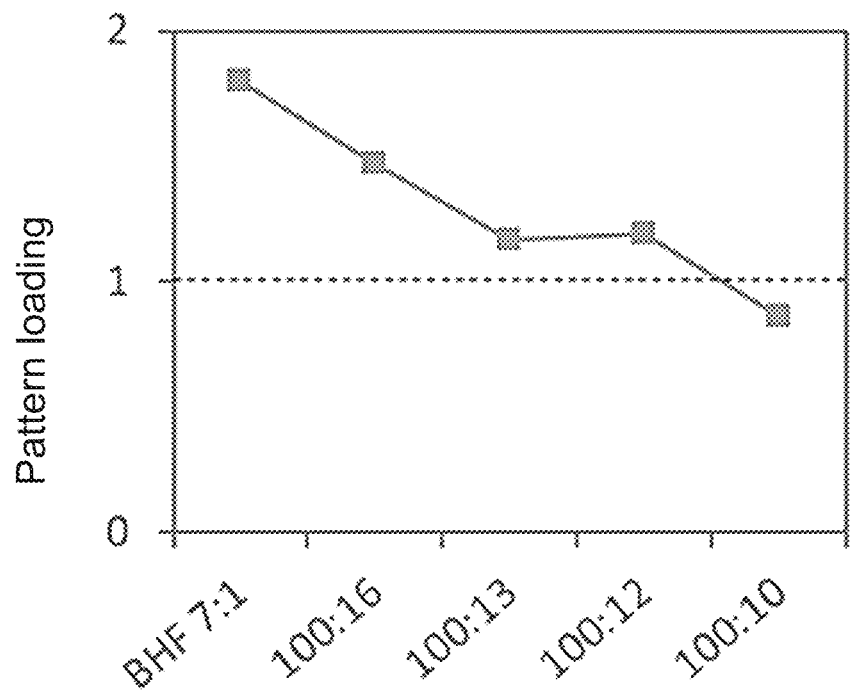
FIG. 2 is a graph showing the pattern loading obtained with aqueous solutions according to the first aspect of the present disclosure and according to the prior art.

Referring r to FIG. 2, the pattern loading observed for BHF 7:1 is compared to the pattern loading observed for embodiments of the present disclosure (100:16, 100:13, 100:12, and 100:10). As can be observed, patterned loading can be greatly attenuated by using aqueous solutions of the present disclosure. For instance, aqueous solution 100:10 permits achievement of a result close to the ideal situation depicted at the bottom of FIG. 5.

Figure 3:
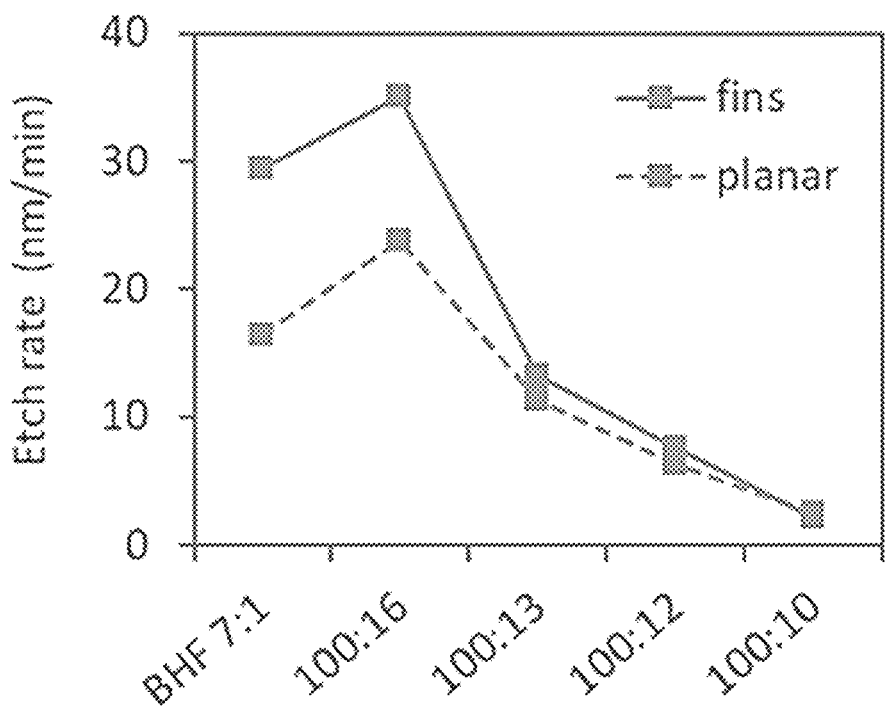
FIG. 3 is a graph showing the etch rate as a function of the composition for aqueous solutions according to the first aspect of the present disclosure and according to the prior art.
Figure 4:
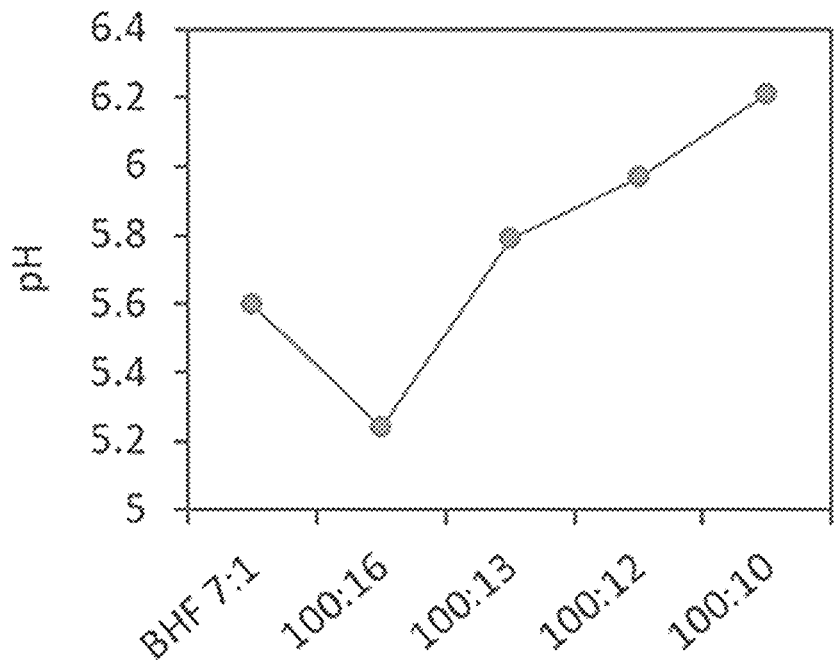
FIG. 4 is a graph showing the pH as a function of the composition for aqueous solutions according to the first aspect of the present disclosure and according to the prior art.

Referring to FIG. 3, the etch rate in the gaps is compared with the etch rate in the space. In addition to the trend already observed in FIG. 2, it also appears that the etch rate diminishes with decreasing HF concentrations. As deducible by comparing FIG. 3 and FIG. 4, the etch rate increases when the pH decreases.

Example 2

Example 1 is repeated but the pH of solutions 100:13 to 100:10 is decreased by 0.5 by adding an adequate amount of HCl. As a result, the pattern loading remains very low but the etching rate increases compared to the etching rate observed for these solutions in Example 1.

It is to be understood that although embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. An aqueous solution comprising the anion $F^-$ in a concentration ranging from 2 to 4 mol/l and a cation of formula $RR'R''R'''N^+$ in a concentration ranging from 1.5 to 2 mol/l, wherein each of R, R', R", and R''' are independently selected from hydrogen and $C_{1-5}$ alkyl chains, wherein the total number of carbon atoms in R, R', R", and R''' combined equals from 8 to 16, wherein the molar ratio between $F^-$ and the cation of formula $RR'R''R'''N^+$ ranges from 1.1 to 2.3, ranges from 1.2 to 2.0, or ranges from 1.3 to 1.7.

2. The aqueous solution according to claim 1, wherein the total number of carbon atoms in R, R', R", and R''' combined equals from 10 to 14.

3. The aqueous solution according to claim 2, wherein the total number of carbon atoms in R, R', R", and R"' combined equals 12.

4. The aqueous solution according to claim 3, wherein R, R', R", and R"' are n-propyl chains.

5. The aqueous solution according to claim 1, wherein the molar ratio between $F^-$ and the cation of formula RR'R"R"'$N^+$ ranges from 1.3 to 1.7.

6. The aqueous solution according to claim 1, wherein the pH of the solution is lower than 6.2, and ranges from 5.1 to 6.1, ranges from 5.2 to 5.9, or ranges from 5.2 to 5.6.

7. The aqueous solution according to claim 6, wherein the pH of the solution ranges from 5.2 to 5.6.

8. The aqueous solution according to claim 6, wherein the aqueous solution comprises one or more acids other than HF.

9. The aqueous solution according to claim 8, wherein the one or more acids are selected from HCl and phosphoric acid.

10. A method for etching a first silicon oxide present in a gap between features, said gap having a width (w) of at most 50 nm, and for etching a second silicon oxide present at a side of a feature, said feature having a width (wf) wherein the second silicon oxide extends for at least two times the addition of the gap width (w) to the feature width (wf) from the side of the feature,
the method comprising exposing the first silicon oxide and the second silicon oxide to an aqueous solution according to claim 1.

11. The method according to claim 10, wherein the first silicon oxide and the second silicon oxide are obtainable by flowable chemical vapor deposition.

12. The method according to claim 10, wherein the density of the first silicon oxide is smaller than the density of the second silicon oxide.

13. The method according to claim 10, wherein before exposing the first silicon oxide and the second silicon oxide to the aqueous solution, the method comprises the steps of:
 a) providing a substrate comprising:
  i) features having a gap therebetween, said gap having a width of at most 50 nm, and
  ii) a space extending for at least two times the addition of the gap width (w) to the feature width (wf) from a feature; and
 b) filling the gap and the space with silicon oxide by flowable chemical vapor deposition, thereby forming the first silicon oxide in the first gap and the second silicon oxide in the space.

14. The method according to claim 10, wherein the width of the gap ranges from 2 to 45 nm, ranges from 5 to 25 nm or ranges from 5 to 20 nm.

15. The method according to claim 14, wherein the width of the gap ranges from 5 to 20 nm.

16. The method according to claim 10, wherein the features are nanofeatures.

17. The method according to claim 7, wherein the nanofeatures are fins having a width of less than 30 nm.

* * * * *